(12) United States Patent
Reichow et al.

(10) Patent No.: US 9,944,188 B2
(45) Date of Patent: Apr. 17, 2018

(54) ON-BOARD ELECTRICAL SYSTEM AND METHOD FOR OPERATING AN ON-BOARD ELECTRICAL SYSTEM

(71) Applicant: Continental Automotive GmbH, Hannover (DE)

(72) Inventors: Dirk Reichow, Wenzenbach (DE); Peter Voelkl, Wenzenbach (DE); Michael Scheurer, Vierkirchen (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 305 days.

(21) Appl. No.: 14/905,863

(22) PCT Filed: Jul. 3, 2014

(86) PCT No.: PCT/EP2014/064157
§ 371 (c)(1),
(2) Date: Jan. 18, 2016

(87) PCT Pub. No.: WO2015/007530
PCT Pub. Date: Jan. 22, 2015

(65) Prior Publication Data
US 2016/0185230 A1    Jun. 30, 2016

(30) Foreign Application Priority Data
Jul. 16, 2013    (DE) .................. 10 2013 213 946

(51) Int. Cl.
*B60L 11/02*    (2006.01)
*B60L 11/18*    (2006.01)
(Continued)

(52) U.S. Cl.
CPC ........... *B60L 11/02* (2013.01); *B60L 11/1809* (2013.01); *G01R 31/3662* (2013.01);
(Continued)

(58) Field of Classification Search
CPC ..................................................... B60L 11/02
(Continued)

(56) References Cited

U.S. PATENT DOCUMENTS

| 2013/0038289 A1 | 2/2013 | Tse ............................. 320/118 |
| 2013/0249565 A1 | 9/2013 | Kuranuki ..................... 324/525 |

(Continued)

FOREIGN PATENT DOCUMENTS

| DE | 19539492 A1 | 4/1997 | ............. G01R 31/36 |
| DE | 19952693 A1 | 5/2001 | ............. G01R 31/36 |

(Continued)

OTHER PUBLICATIONS

German Office Action, Application No. 102013213946.2, 5 pages, dated Mar. 24, 2014.

(Continued)

*Primary Examiner* — Joseph Chang
(74) *Attorney, Agent, or Firm* — Slayden Grubert Beard PLLC (57) ABSTRACT

An on-board electrical system for a vehicle comprising: a first energy store; a second energy store; a DC/DC converter bidirectionally transferring energy between the first energy store and the second energy store; and two switching devices for coupling a first terminal of the second energy store to a first terminal of the first energy store via a first node, a second node, and a third node. The system further comprises: four current determining units for: a first current flowing between the first terminal of the first energy store and the first node, a second current flowing via the first switching device and the second switching device, a third current flowing between the first terminal of the second energy store and the second node, and a fourth current flowing between the third node and the DC/DC converter; an electrical resistor couplable to the first terminal of the (Continued)

second energy store by means of a third switching device; a voltage determining unit determining a first voltage value of the second energy store if the electrical resistor is electrically isolated from the first terminal of the second energy store and a second voltage value of the second energy store if the electrical resistor is electrically coupled to the first terminal of the second energy store; and an internal resistance determining unit for characterizing an internal resistance of the second energy store on the basis of determined first voltage and the second voltage and for classifying the determined resistance value on the basis of the determined first, second, third, and fourth current values.

20 Claims, 6 Drawing Sheets (51) Int. Cl.
    H02M 3/158       (2006.01)
    G01R 31/36       (2006.01)
    G01R 31/00       (2006.01)
(52) U.S. Cl.
    CPC .......... *H02M 3/158* (2013.01); *G01R 31/007* (2013.01); *G01R 31/3658* (2013.01); *G01R 31/3679* (2013.01)

(58) Field of Classification Search
    USPC ....................................................... 307/10.1
    See application file for complete search history.

(56) References Cited

U.S. PATENT DOCUMENTS

| 2014/0354040 A1 | 12/2014 | Reichow et al. | 307/9.1 |
| 2015/0008929 A1 | 1/2015 | Ehrmann et al. | 324/426 |
| 2016/0137069 A1* | 5/2016 | Ishigaki | B60L 11/02 307/10.1 |

FOREIGN PATENT DOCUMENTS

| DE | 10240243 A1 | 3/2004 | G01R 19/00 |
| DE | 102007006477 A1 | 8/2008 | B60R 16/033 |
| DE | 102011086829 A1 | 5/2013 | B60R 16/03 |
| DE | 102011087678 A1 | 6/2013 | B60R 16/033 |
| EP | 1220766 B1 | 2/2007 | B60R 16/02 |
| WO | 2012/160754 A1 | 11/2012 | G01R 31/36 |
| WO | 2015/007530 A1 | 1/2015 | G01R 31/00 |

OTHER PUBLICATIONS

International Search Report and Written Opinion, Application No. PCT/EP2014/064157, 21 pages, dated Nov. 6, 2014.

* cited by examiner

… determining a second voltage value of the voltage of the second energy store if the electrical resistor is electrically coupled to the first terminal of the second energy store. In addition, the on-board electrical system comprises an internal resistance determining unit, wherein the internal resistance determining unit is designed for determining a resistance value characterizing an internal resistance of the second energy store on the basis of the determined first voltage value and the determined second voltage value and for classifying the determined resistance value on the basis of the determined first, second, third and fourth current values.

DETAILED DESCRIPTION

The on-board electrical system in accordance with the abovementioned aspects or variants of the disclosure may provide an improved determination of a resistance value characterizing the internal resistance of the second energy store. This is effected, in particular, by the provision of the first, second, third and fourth current determining units, the voltage determining unit and the internal resistance determining unit designed for determining a resistance value characterizing an internal resistance of the second energy store on the basis of the determined first voltage value and the determined second voltage value and for classifying the determined resistance value on the basis of the determined first, second, third and fourth current values. As a result, as will be explained in greater detail below, it is possible to ascertain whether the determination of the resistance value characterizing the internal resistance of the second energy store is effected at a suitable point in time or during a suitable system state of the on-board electrical system and a verification and/or plausibilization of the determined resistance value can thus be effected.

As accurate knowledge as possible of the resistance value characterizing the internal resistance of the second energy store is of particular importance here with regard to safety and availability aspects of the on-board electrical system. In particular, a state of health of the second energy store, also designated as SOH, can be determined or predicted on the basis of the determined resistance value. This is particularly advantageous in the case of vehicles having a stop/start system and a start/stop system designed in particular for automatically shutting off and starting an internal combustion engine of the vehicle. By way of example, it is possible to determine whether the state of health of the second energy store suffices to carry out a restart of the internal combustion engine after the internal combustion engine has been automatically shut off.

In one embodiment of the abovementioned on-board electrical systems, the electrical resistor has a predetermined resistance value. As a result, it is not necessary to measure the value of the electrical resistor, rather the predetermined resistance value can be used for determining the resistance value characterizing the internal resistance of the second energy store.

In a further embodiment, the internal resistance determining unit is additionally designed for classifying the determined resistance value on the basis of the determined first voltage value and the determined second voltage value. This advantageously enables a further improved plausibilization of the determined resistance value characterizing the internal resistance of the second energy store, as will be explained in greater detail below.

The first on-board electrical system branch can additionally comprise a first electrical load.

In a further embodiment, the DC/DC converter, the first switching device, the second switching device, the third switching device, the electrical resistor and the internal resistance determining unit are part of a control unit. The abovementioned components can thus be provided in a single module in the form of the control unit.

The first switching device, the second switching device and the third switching device can be selected from the group consisting of a relay and a semiconductor switch, in particular a MOSFET switch or an IGBT switch. It is thus possible to carry out an electrical coupling or isolation of the respective components of the on-board electrical system via the abovementioned switching devices in a simple and reliable manner.

The second on-board electrical system branch can additionally comprise a second electrical load. Furthermore, the on-board electrical system can comprise a third on-board electrical system branch, wherein the third on-board electrical system branch comprises a third electrical load.

In a further configuration, the on-board electrical system additionally comprises a starter of an internal combustion engine of the vehicle and/or a generator. In this case, the starter can be designed in particular as a pinion starter or as a belt starter and the generator can be part of the first on-board electrical system branch or of the third on-board electrical system branch.

In one configuration, the DC/DC converter is designed as a synchronous converter. It is thus possible to enable an energy transfer between the first on-board electrical system branch, the second on-board electrical system branch and, if appropriate, the third on-board electrical system branch in a simple manner.

The first energy store and the second energy store are selected for example from the group consisting of at least one rechargeable battery, in particular at least one Li-ion rechargeable battery or at least one lead-acid rechargeable battery, and at least one capacitor, in particular at least one double-layer capacitor, and combinations of the abovementioned elements.

The teachings of the present disclosure may be applied to a vehicle comprising an on-board electrical system according to one of the abovementioned embodiments. The vehicle is for example a motor vehicle, in particular an automobile or a truck, and can be designed as a hybrid vehicle or as a vehicle having solely an internal combustion engine drive.

A further aspect of the disclosure relates to a method for operating an on-board electrical system according to one of the abovementioned embodiments, wherein the method comprises the following steps. The method involves determining a first voltage value of a voltage of the second energy store by means of the voltage determining unit, a first current value by means of the first current determining unit, a second current value by means of the second current determining unit, a third current value by means of the third current determining unit and a fourth current value by means of the fourth current determining unit if the electrical resistor is electrically isolated from the first terminal of the second energy store. In addition the method involves closing the third switching device. Furthermore, the method involves determining a second voltage value of the voltage of the second energy store and repeatedly determining a first current value by means of the first current determining unit, a second current value by means of the second current determining unit, a third current value by means of the third current determining unit and a fourth current value by means of the fourth current determining unit if the electrical resistor is electrically coupled to the first terminal of the second energy store. Moreover, the method involves determining a resistance value characterizing an internal resistance of the second energy store on the basis of the determined first voltage value and the determined second voltage value, and classifying the determined resistance value on the basis of the determined first, second, third and fourth current values.

In one embodiment of the method, classifying the determined resistance value comprises comparing in each case the first current values determined before and after the closing of the third switching device, the second current values determined before and after the closing of the third switching device, the third current values determined before and after the closing of the third switching device and the fourth current values determined before and after the closing of the third switching device with one another.

In a further embodiment of the method, classifying the determined resistance value is additionally carried out on the basis of the determined first voltage value and the determined second voltage value. This advantageously enables a further improved plausibilization of the determined resistance value characterizing the internal resistance of the second energy store.

In a further embodiment of the method, a time determination is additionally carried out after the third switching device has been closed. In the aforementioned configuration, determining the second voltage value is carried out after a predetermined time duration after the beginning of the time determination.

After the closing of the third switching device, the voltage of the second energy store can be repeatedly determined. In the aforementioned configuration, the second voltage value is determined if a deviation of successively determined values of the voltage from one another falls below a predetermined threshold value. As a result, the determination of the second voltage value can be carried out after the voltage has stabilized after the closing of the third switching device and a particularly suitable point in time for measurement can thus be provided.

In a further embodiment of the method, the method additionally involves opening the third switching device after determining the resistance value characterizing the internal resistance of the second energy store. Furthermore, the method involves determining a third voltage value of the voltage of the second energy store and repeatedly determining a first current value by means of the first current determining unit, a second current value by means of the second current determining unit, a third current value by means of the third current determining unit and a fourth current value by means of the fourth current determining unit if the electrical resistor is electrically isolated from the first terminal of the second energy store. In the abovementioned embodiment, classifying the determined resistance value is additionally carried out on the basis of the determined third voltage value and the determined first, second, third and fourth current values which are determined if the electrical resistor is electrically isolated from the first terminal of the second energy store. This enables a further improved plausibilization of the determined resistance value characterizing the internal resistance of the second energy store.

Embodiments of the invention will now be explained in greater detail with reference to the accompanying figures.

Figure 1A:
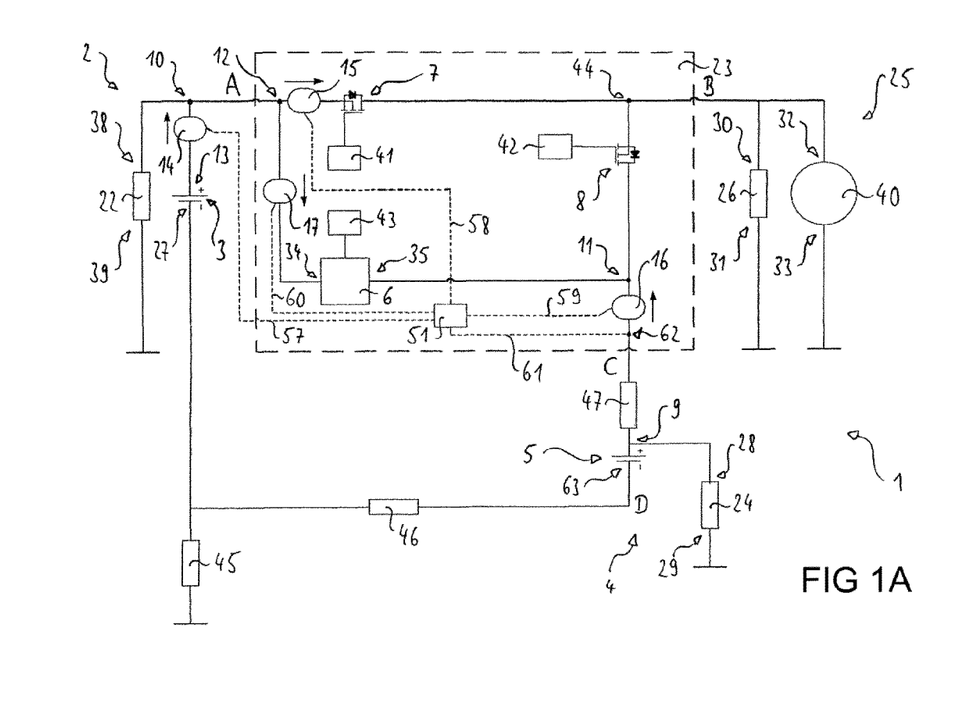
FIG. 1A shows a block diagram of an on-board electrical system in accordance with a first embodiment of the invention.

FIG. 1A shows a block diagram of an on-board electrical system of a vehicle (not illustrated in more specific detail) in accordance with a first embodiment of the invention. The on-board electrical system 1 can be for example part of a motor vehicle, in particular of an automobile or of a truck.

The on-board electrical system 1 comprises a first on-board electrical system branch 2 having a first nominal voltage $U_1$, which can also be designated as Vsys1, wherein the first on-board electrical system branch 2 comprises a first electrical energy store 3 and a first electrical load 22. In the embodiment shown, the first electrical energy store 3 is designed as a 12-volt rechargeable battery, for example as a 12-volt Li-ion rechargeable battery. The first electrical load 22 forms a dynamic load and can be designed for example as a starter of an internal combustion engine (not illustrated in more specific detail) of the vehicle. In addition, the on-board electrical system 1 comprises a second on-board electrical system branch 4 having a second nominal voltage $U_2$, which can also be designated as Vsys2. In the embodiment shown, the second on-board electrical system branch 4 comprises a second electrical energy store 5 and a second electrical load 24. The second electrical energy store 5 is for example in turn designed as a 12-volt rechargeable battery, in particular as a 12-volt Li-ion rechargeable battery, or as a 12-volt capacitor arrangement.

The second electrical load 24 is formed for example by sensors for the diagnosis of the system.

Furthermore, in the embodiment shown, the on-board electrical system 1 comprises a third on-board electrical system branch 25 having a third nominal voltage $U_3$, which is also designated as Vsys3. The third on-board electrical system branch 25 comprises a third electrical load 26, which forms a dynamic load, for example an electrical steering system. Furthermore, the on-board electrical system 1 comprises a generator 40, which is part of the third on-board electrical system branch 25 in the embodiment shown. The generator 40 is connected to the internal combustion engine of the vehicle via a mechanical coupling (not illustrated in more specific detail), for example a V-ribbed belt.

In the embodiment shown, the first on-board electrical system branch 2, the second on-board electrical system branch 4 and the third on-board electrical system branch 25 have the same nominal voltage, that is to say that Vsys1=Vsys2=Vsys3. In the embodiment shown, the nominal voltage is 12 V. Furthermore, the nominal voltage can be 14 V or, particularly in the case of trucks, 24 V or 48 V.

The on-board electrical system 1 furthermore comprises a DC/DC converter 6, which is designed as a bidirectional DC voltage converter and can convert, in particular, a first electrical voltage into a second electrical voltage, and vice versa. For this purpose, in the embodiment shown, the DC/DC converter 6 is designed as a synchronous converter for bidirectionally transferring energy between the first on-board electrical system branch 2 and the second on-board electrical system branch 4.

Furthermore, the on-board electrical system 1 comprises a first switching device 7 and a second switching device 8, wherein the first switching device 7 and the second switching device 8 are designed as semiconductor switches in the form of normally off n-channel MOSFET switches in the embodiment shown. In this case, the body diode inherent to a MOSFET advantageously enables a further redundancy particularly of the first switching device 7 and prevents an undesired discharge of the second electrical energy store 5 into the first on-board electrical system branch 2 or the third on-board electrical system branch 25. In a further configuration, the first switching device 7 and/or the second switching device 8 can be designed as semiconductor switches in the form of IGBT switches or as relays.

The first switching device 7, on a first contact side, i.e. on the source side in the embodiment shown, is connected to a first terminal 13 of the first electrical energy store 3 and a first terminal 38 of the first electrical load 22 via a first node 10 and a third node 12. Furthermore, the first switching device 7, on the source side, is connected to a first terminal 34 of the DC/DC converter 6 via the third node 12.

On a second contact side, i.e. on the drain side in the embodiment shown, the first switching device 7 is connected via a fourth node 44 to a first contact side of the second switching device 8, i.e. the source side of the second switching device 8 in the embodiment shown, and to a first terminal 30 of the third electrical load 26 and a first terminal 32 of the generator 40.

The second switching device 8, on a second contact side, i.e. on the drain side in the embodiment shown, is connected via a second node 11 to a second terminal 35 of the DC/DC converter 6 and a first terminal 9 of the second electrical energy store 5 and a first terminal 28 of the second electrical load 24. On the source side, the second switching device 8 is furthermore connected to the first terminal 30 of the third electrical load 26 and the first terminal 32 of the generator 40 via the fourth node 44.

A second terminal 27 of the first electrical energy store 3, a second terminal 39 of the first electrical load 4, a second terminal 63 of the second electrical energy store 5 and a second terminal 29 of the second electrical load 24 are electrically coupled to a reference potential in the form of a ground potential. Furthermore, a second terminal 31 of the third electrical load 26 and a second terminal 33 of the generator 40 are electrically coupled to the reference potential.

A pole A of a four-pole network is formed on the source side of the first switching device 7. Furthermore, a pole B is formed on the source side of the second switching device 8 and a pole C of the four-pole network is formed on the drain side of the second switching device 8. A pole D of the four-pole network is formed by the reference potential.

In a closed switching state of the first switching device 7 and a simultaneously closed switching state of the second switching device 8, that is to say—in the embodiment shown—when a control voltage in the form of a corresponding differential gate-source voltage is applied to the gate of the respective n-channel MOSFET, in the case of which an electrically conductive channel is formed, the first terminal 9 of the second electrical energy store 5 is electrically coupled to the first on-board electrical system branch 2 via the first node 10, the second node 11 and the third node 12. In this case, the first terminal 9 of the second electrical energy store 5 is electrically coupled to the positive path of the first on-board electrical system branch 2, that is to say the first terminal 13 of the first electrical energy store 3 and the first terminal 38 of the first electrical load 22.

In an open switching state of the first switching device 7 and a simultaneously open switching state of the second switching device 8, that is to say when a differential gate-source voltage is applied to the gate of the n-channel MOSFETs, in the case of which no electrically conductive channel is formed, and with the DC/DC converter 6 simultaneously being deactivated or inactive, the first terminal 9 is electrically isolated from the first on-board electrical system branch 2. If only one of the two switching devices 7 and 8 is open and the respective other switching device is closed and, in addition, the DC/DC converter 6 is deactivated, the first terminal 9 of the second electrical energy store 5 is likewise electrically isolated from the first on-board electrical system branch 2 in the embodiment shown.

In the embodiment shown, the on-board electrical system 1 additionally comprises a first drive unit 41 designed for driving the first switching device 7, and a second drive unit 42 designed for driving the second switching device 8, and a third drive unit 43 designed for driving the DC/DC converter 6. The first drive unit 41, the second drive unit 42 and the third drive unit 43 can be at least partly monolithically integrated in this case.

By means of the third drive unit 43, it is possible to define, in particular, the direction of an energy transfer between the first on-board electrical system branch 2 and the second on-board electrical system branch 4 via the DC/DC converter 6. Furthermore, the regulation operation of the DC/DC converter 6 can thus be defined, that is to say it is possible to ascertain whether the DC/DC converter 6 is operated in a voltage-regulated manner, in a current-regulated manner or in a power-regulated manner. In addition, the first drive unit 41, the second drive unit 42 and/or the third drive unit 43 can be coupled to further vehicle components (not illustrated in more specific detail), in particular further control units of the vehicle, in order to generate drive signals for driving the first switching device 7, the second switching device 8 and the DC/DC converter 6 depending on a respective operating state of the vehicle.

Furthermore, the on-board electrical system 1 comprises a first current determining unit 14 designed for determining a first current value of a first current flowing between the first terminal 13 of the first energy store 3 and the first node 10, said first current being illustrated schematically by means of an arrow. In addition, the on-board electrical system 1 comprises a second current determining unit 15 designed for determining a second current value of a second current flowing via the first switching device 7 and the second switching device 8, said second current being illustrated schematically by means of an arrow. Furthermore, the on-board electrical system 1 comprises a third current determining unit 16 designed for determining a third current value of a third current flowing between the first terminal 9 of the second energy store 5 and the second node 11, said third current being illustrated schematically by means of an arrow. Moreover, the on-board electrical system 1 comprises a fourth current determining unit 17 designed for determining a fourth current value of a fourth current flowing between the third node 12 and the DC/DC converter 6, said fourth current being illustrated schematically by means of an arrow. The first current determining unit 14, the second current determining unit 15, the third current determining unit 16 and the fourth current determining unit 17 are designed for example as current sensors, in particular as a Hall element, or as a shunt.

Furthermore, the on-board electrical system 1 comprises a module 51. The module 51 comprises an electrical resistor (not illustrated in more specific detail in FIG. 1A), wherein the electrical resistor is electrically couplable to the first terminal 9 of the second energy store 5 by means of a third switching device (likewise not illustrated in more specific detail in FIG. 1A). Moreover, the module 51 comprises a voltage determining unit (not illustrated more specifically in FIG. 1A), wherein the voltage determining unit is designed for determining a first voltage value of a voltage of the second energy store 5 if the electrical resistor is electrically isolated from the first terminal 9 of the second energy store 5. Furthermore, the voltage determining unit is designed for determining a second voltage value of the voltage of the second energy store 5 if the electrical resistor is electrically coupled to the first terminal 9 of the second energy store 5. In addition, the module 51 comprises an internal resistance determining unit (not illustrated in more specific detail in FIG. 1A), wherein the internal resistance determining unit is designed for determining a resistance value characterizing an internal resistance of the second energy store 5 on the basis of the determined first voltage value and the determined second voltage value and for classifying the determined resistance value on the basis of the determined first, second, third and fourth current values.

For this purpose, the module 51 is connected to the first current determining unit 14 via a signal line 57. Furthermore, the module 51 is connected to the second current determining unit 15 via a signal line 58, to the third current determining unit 16 via a signal line 59 and to the fourth current determining unit 17 via a signal line 60. Moreover, the module 51 is connected via a measuring line 61 to a voltage tap 62 in the region of the first terminal 9 of the second energy store 5.

By means of the embodiment of the invention shown, the determination of the static internal resistance, which is also designated as static ESR (equivalent series resistance in the case of capacitors), of the second energy store 5 is made possible in particular by means of a monolithically integrated circuit. As a result, by detecting an extended number of system parameters and storing the latter even under unfavorable system conditions, for example tearing away or absence of sensor lines or an arbitrary dynamic voltage offset within the system, it is possible to enable a higher accuracy of the determination by the provision of criteria for invalid and valid measurements. In this case, the internal resistance of an energy store is typically a particularly suitable means for estimating the availability or remaining lifetime of said energy store.

In the embodiment shown, the electrical resistor has a predetermined or predefined resistance value. The latter can be stored for example as a constant quantity in an algorithm for calculation, wherein the stored resistance value already includes possible tolerances, in particular on account of aging and/or temperature fluctuations. Since the resistance value of the electrical resistor is thus known, it is possible to determine the sum of the internal resistance of the second energy store 5 and the lead resistances with respect to the second energy store 5 as far as the measurement points, as will be explained in greater detail below.

Assuming an ideal connection of the module 51 to the poles C and D of the four-pole network, the internal resistance $R_{BAT\_ES2}$ of the second energy store 5 results from the following equation:

$$R_{BAT\_ES2} = (U_{PRE}/U_{ADD} - 1) \cdot R_{ADD},$$

wherein $R_{ADD}$ is the resistance value of the electrical resistor, $U_{PRE}$ is the voltage of the second energy store 5 if the electrical resistor is electrically isolated from the first terminal 9 of the second energy store 5, i.e. with an open third switching device before the connection of the electrical resistor, and $U_{ADD}$ is the voltage of the second energy store 5 if the electrical resistor is electrically coupled to the first terminal 9 of the second energy store 5, i.e. with a closed third switching device during the connection of the electrical resistor.

These conditions are typically not provided in the real system. In this regard, by way of example, the pole D is not reachable by means of a dedicated sensor line and cabling or line resistances and contact or contacting resistances occur at junction points, which can be of the order of magnitude of the resistance to be measured or even higher. FIG. 1A shows a system arrangement in which the second energy store 5 cannot be optimally connected. In this case, in FIG. 1A, by way of example, cabling or line resistances and contact or contacting resistances at junction points are illustrated schematically by means of a first electrical resistor 45, which is also designated as $R_{HAR1}$, a second electrical resistor 46, which is also designated as $R_{HAR2}$, and a third electrical resistor 47, which is also designated as $R_{HAR3}$. The electrical resistors 45, 46 and 47, in contrast to the electrical resistor mentioned above, thus constitute parasitic components of the on-board electrical system 1.

For this case under consideration, a measurement result of $R_{BAT\_ES2} = ESR + R_{HAR1} + R_{HAR2} + R_{HAR3}$ thus arises, wherein ESR indicates the internal resistance of the second energy store 5. The resistance value $R_{BAT\_ES2}$ thus constitutes a resistance value characterizing the internal resistance of the second energy store 5 which deviates from the internal resistance of the second energy store 5 by the cabling or line resistances and contact or contacting resistances that occur.

Knowledge of the additional current measurement values in the system affords the possibility of plausibilizing the measurement results. This affords the possibility of determining valid diagnosis information by simultaneous parameter detection or measurement and storage of these parameters for independent system and vehicle states or for significantly more operating states. This affords advantages in the case of safety-relevant applications since the second energy store 5 can serve as system energy store backup or system energy store support. Furthermore, the system availability can be diagnosed or projected for various operating states.

Furthermore, there is the possibility of varying the loading resistance $R_{ADD}$ for optimally adapting the differential voltage measurement value and limiting the power loss in the arrangement.

A current measurement through the loading resistance $R_{ADD}$ is not directly required in this case. In the embodiment shown, the direct measurement current determination is replaced by the detection of the system currents, i.e. of the first, second, third and fourth current values, in particular for the plausibilization and assessment of the determined resistance value $R_{BAT\_ES2}$ characterizing the internal resistance of the second energy store 5 by means of the module 51.

By connecting a defined load $R_{ADD}$, it is possible to choose the point in time for measurement for different system states, for example in the event of the vehicle being driven, moving or being at a standstill, an engine start, a charging or discharging of the energy stores.

A plausibilization and an assessment of the determined resistance value $R_{BAT\_ES2}$ characterizing the internal resistance of the second energy store 5 by means of the module 51 are carried out as follows in the embodiment shown. If at least one of the current intensity values determined during the connection of the electrical resistor, i.e. at least one of the determined first, second, third and fourth current values, if the electrical resistor is electrically coupled to the first terminal 9 of the second energy store 5, is greatly different than the corresponding current intensity value determined before the connection of the electrical resistor or after the renewed isolation of the electrical resistor, i.e. the corresponding first, second, third or fourth current value determined with the third switching device open, and a current jump thus occurs at least one of the current measurement points, this is a criterion for rejecting the determined value $R_{BAT\_ES2}$, for example if the current jump is above a specific limit, i.e. the difference between current intensity values determined before the connection of the electrical resistor or after the renewed isolation of the electrical resistor and current intensity values determined during the connection of the electrical resistor exceeds a predetermined threshold value.

Moreover, classifying the determined resistance value can additionally be carried out on the basis of the determined first voltage value, the determined second voltage value and the determined third voltage value. By way of example, the determined resistance value can be rejected if the difference between the voltage of the second energy store 5 determined before the connection of the electrical resistor and the voltage determined during the connection of the electrical resistor and/or the difference between the voltage of the second energy store 5 determined during the connection of the electrical resistor and the voltage determined after the renewed isolation of the electrical resistor exceeds a first predetermined threshold value or at least one of the determined voltages deviates from the nominal voltage of the second on-board electrical system branch 4 by a second predetermined threshold value.

In this case, the measurement can be carried out independently of external load resistances and thus, for example, also with the DC/DC converter 6 activated.

This measurement principle can be applied to the first energy store 3, the second energy store 5 and a third energy store (not illustrated in FIG. 1A), which is optionally arranged in the third on-board electrical system branch 25.

Given the presence of a sensor line from the module 51 to the pole D, by means of two successive voltage measurements (between pole C and pole D and then between pole C and the reference potential),
it is possible to determine the values of $R_{HAR1}$ and $R_{HAR2}$ and thus to work out the influence thereof in the measurement of the internal resistance of the second energy store 5.

In this case, the measuring system chosen is advantageously independent of the used technology of the energy stores. In addition, an internal resistance determination can take place for example during a starting process (cranking), with the DC/DC converter 6 activated, during a transition from a high power mode (HPM) to a low power mode (LPM) or vice versa.

Figure 3:
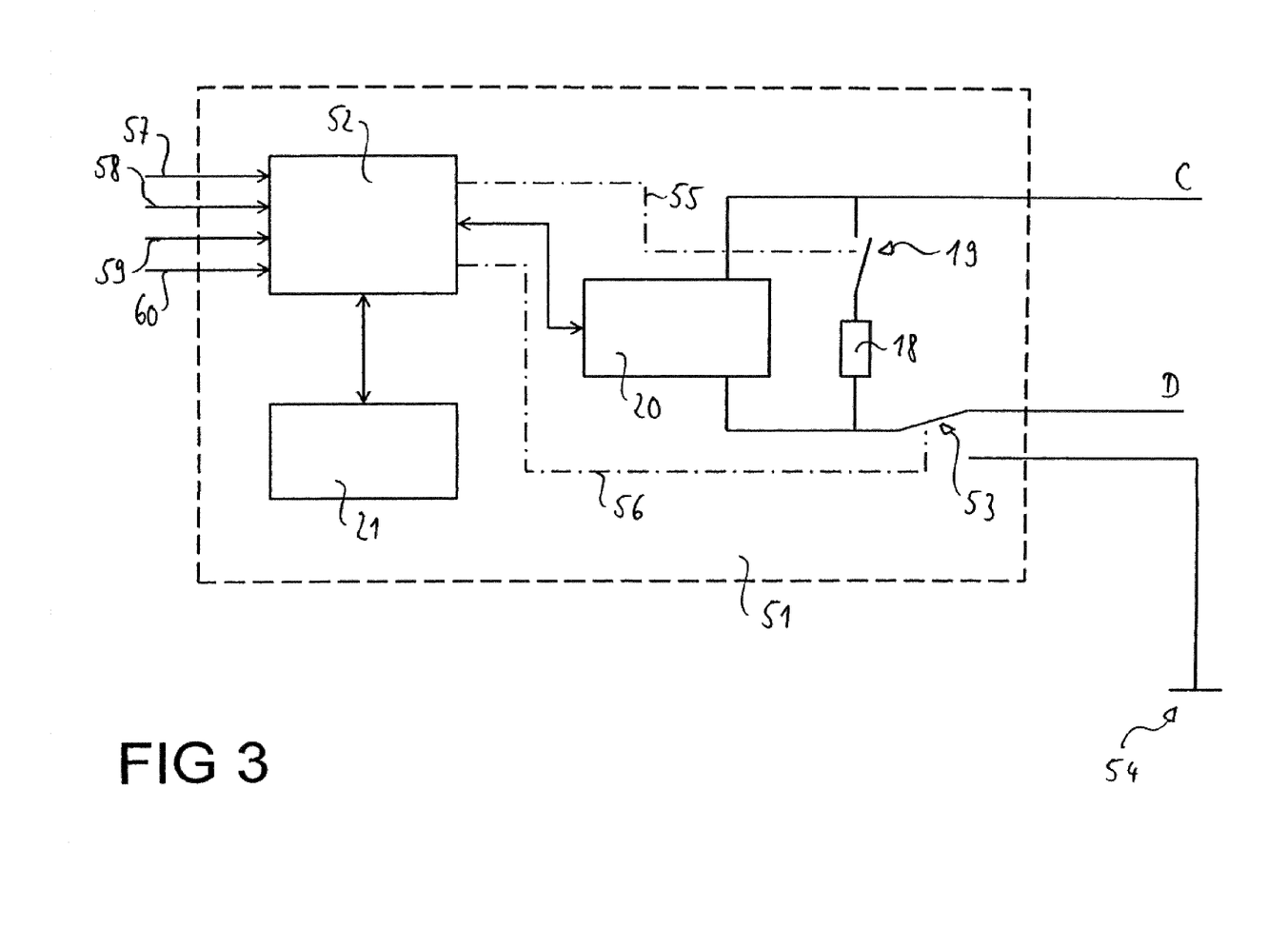
FIG. 3 shows a block diagram of the module shown in FIGS. 1A to 2 in accordance with one embodiment.

The electrical resistor, the third switching device, the voltage determining unit and the internal resistance determining unit will furthermore be explained further in association with FIG. 3.

In the embodiment shown, the DC/DC converter 6, the first switching device 7, the second switching device 8, the third switching device, the electrical resistor, the internal resistance determining unit, the first drive unit 41, the second drive unit 42 and the third drive unit 43 are part of a control unit 23, also designated as (CU). The control unit controls or regulates the energy flows within the overall system.

Figure 1B:
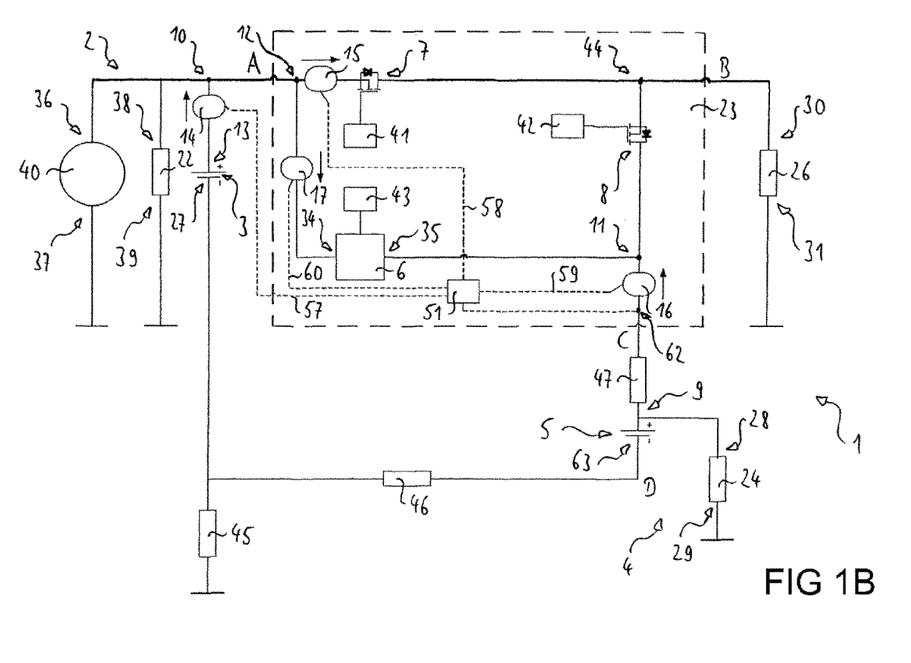
FIG. 1B shows a block diagram of an on-board electrical system in accordance with a second embodiment of the invention.

FIG. 1B shows a block diagram of an on-board electrical system of a vehicle (not illustrated in more specific detail) in accordance with a second embodiment of the invention. Components having the same functions as in FIG. 1A are identified by the same reference signs and will not be explained again below.

The on-board electrical system 1 in accordance with FIG. 1B differs from the embodiment shown in FIG. 1A in that the generator 40
is part of the first on-board electrical system branch 2. Therefore, in the embodiment shown, the first switching device 7, on the source side, is connected to a first terminal 36 of the generator 40, the first terminal 38 of the first electrical load 22 and the first terminal 13 of the first electrical energy store 3. In the embodiment shown, the second switching device 8, on the source side, is connected to the first terminal 30 of the third electrical load 26 and the drain side of the first switching device 7. A second terminal 37 of the generator 40 is electrically coupled to the reference potential.

Determining a resistance value characterizing an internal resistance of the second energy store 5 on the basis of a determined first voltage value and a determined second voltage value and classifying the determined resistance value on the basis of determined first, second, third and fourth current values are carried out in accordance with the procedure explained in FIG. 1A.

The on-board electrical system topologies shown in FIGS. 1A and 1B are also referred to here as DBM (Dual Battery Management).

Figure 2:
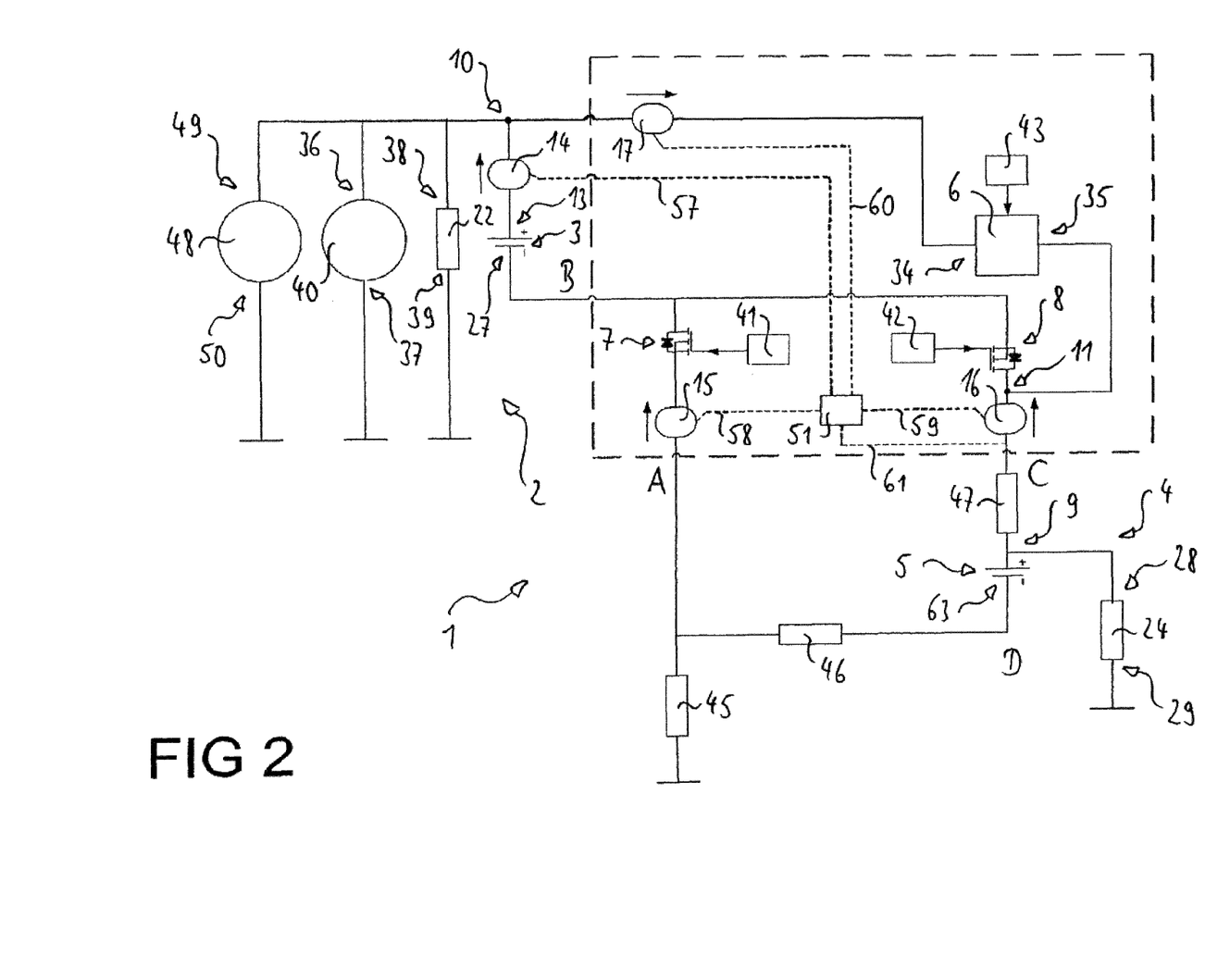
FIG. 2 shows a block diagram of an on-board electrical system in accordance with a third embodiment of the invention.

FIG. 2 shows a block diagram of an on-board electrical system 1 of a vehicle (not illustrated in more specific detail) in accordance with a third embodiment of the invention. Components having the same functions as in FIGS. 1A and 1B are identified by the same reference signs and will not be explained again below.

In this case, the on-board electrical system topology shown in figure is also designated as VSS (Voltage Stabilization System) and differs from the embodiments shown in FIGS. 1A and 1B in that the second terminal 27 of the first electrical energy store 3 is electrically connected to the drain side of the first switching device 7 and the source side of the second switching device 8. Furthermore, the first switching device 7 is coupled to the reference potential on the source side.

In this case, the first terminal 9 of the second electrical energy store 5 is electrically couplable to the first terminal 13 of the first energy store 3 via the first node 10, the second node 11 and the DC/DC converter 6. Furthermore, the first terminal 11 of the second electrical energy store 6 is electrically coupled to the reference potential in a closed switching state of the first switching device 7 and a closed switching state of the second switching device 8 and is electrically isolated from the reference potential in an open switching state of the first switching device 7 and an open switching state of the second switching device 8. Independently of the switching state of the first switching device 7, the first terminal 9 of the second electrical energy store 5 is electrically coupled to the second terminal 27 of the first electrical energy store 3 given a closed switching state of the second switching device 8. The first electrical energy store 3 and the second electrical energy store 5 can thus be electrically connected in series given a closed second switching device 8 and simultaneously open first switching device 7.

In the embodiment shown, the on-board electrical system 1 merely comprises two on-board electrical system branches in the form of the first on-board electrical system branch 2 and the second on-board electrical system branch 4. Furthermore, in the embodiment shown, the on-board electrical system 1 comprises a starter 48, which is designed for example as a pinion starter and is part of the first on-board electrical system branch 2, wherein a first terminal 49 of the starter 48 is connected to the positive path of the first on-board electrical system branch 2 and a second terminal 50 of the starter 48 is coupled to the reference potential. In the embodiment shown,
the generator 40 is designed as a starter generator and is likewise part of the first on-board electrical system branch 2.

In the embodiment shown, the first on-board electrical system branch 2 has a nominal voltage that is greater than the nominal voltage of the second on-board electrical system branch 4, that is to say that Vsys1>Vsys2. By way of example, the nominal voltage Vsys1 is 12 V or 14 V and the nominal voltage Vsys2 is 3 V to 5 V.

A pole A of a four-pole network is formed on the source side of the first switching device 7. Furthermore, the second terminal 27 of the first electrical energy store 3 forms a pole B of the four-pole network. A pole C is formed on the source side of the second switching device 8 and a pole D of the four-pole network is formed by the reference potential.

Furthermore, the on-board electrical system 1 comprises a first current determining unit 14 designed for determining a first current value of a first current flowing between the first terminal 13 of the first energy store 3 and the first node 10, said first current being illustrated schematically by means of an arrow. In addition, the on-board electrical system 1 comprises a second current determining unit 15 designed for determining a second current value of a second current flowing via the first switching device 7, said second current being illustrated schematically by means of an arrow. Furthermore, the on-board electrical system 1 comprises a third current determining unit 16 designed for determining a third current value of a third current flowing between the first terminal 9 of the second energy store 5 and the second node 11, said third current being illustrated schematically by means of an arrow. Moreover, the on-board electrical system 1 comprises a fourth current determining unit 17 designed for determining a fourth current value of a fourth current flowing between the first node 10 and the DC/DC converter 6,
said fourth current being illustrated schematically by means of an arrow.

Furthermore, the module 51 comprises an electrical resistor (not illustrated in more specific detail in FIG. 2), wherein the electrical resistor is electrically couplable to the first terminal 9 of the second energy store 5 by means of a third switching device (likewise not illustrated in more specific detail in FIG. 2). Moreover, the module 51 comprises a voltage determining unit (not illustrated in more specific detail in FIG. 2), wherein the voltage determining unit is designed for determining a first voltage value of a voltage of the second energy store 5 if the electrical resistor is electrically isolated from the first terminal 9 of the second energy store 5 and for determining a second voltage value of the voltage of the second energy store 5 if the electrical resistor is electrically coupled to the first terminal 9 of the second energy store 5. In addition, the module 51 comprises an internal resistance determining unit (not illustrated in more specific detail in FIG. 2), wherein the internal resistance determining unit is designed for determining a resistance value characterizing an internal resistance of the second energy store 5 on the basis of the determined first voltage value and the determined second voltage value and for classifying the determined resistance value on the basis of the determined first, second, third and fourth current values.

Determining the resistance value characterizing the internal resistance of the second energy store 5 on the basis of the determined first voltage value and the determined second voltage value and classifying the determined resistance value on the basis of the determined first, second, third and fourth current values are carried out here in accordance with the procedure explained in FIG. 1A.

FIG. 3 shows a block diagram of the module 51 shown in FIGS. 1A to 2 in accordance with one embodiment. Components having the same functions as in the previous figures are identified by the same reference signs and will not be explained again below.

The module 51, which can be at least partly monolithically integrated, comprises monitoring units in the form of a module 52 and a voltage determining unit 20, already explained in association with the previous figures. In this case, the voltage determining unit 20 detects the voltage $U_{BAT\_ES2}$. The module 52 and the voltage determining unit 20 can also be combined in a common unit.

Furthermore, the module 51 comprises an electrical resistor 18, already explained in association with the previous figures, said electrical resistor forming the loading resistance $R_{ADD}$ explained above, a third switching device 19, likewise already explained in association with the previous figures, and additionally—in the embodiment shown—a fourth switching device 53. The electrical resistor 18 is designed for example as a chip resistor having a predetermined resistance value. In this case, the resistance value is typically chosen in such a way that a voltage drop in the case of loading by the resistor 18, i.e. with the third switching device 19 closed, is approximately 0.5 to one percent of the nominal voltage of the second on-board electrical system branch.

The module 52 controls the third switching device 19 and the fourth switching device 53. For this purpose, the module 52 is connected to the third switching device 19 via a control line 55 and to the fourth switching device 53 via a control line 56. Furthermore, the module 52 detects the system quantities of first,
second, third and fourth current values and, for this purpose, is connected to the signal lines 57, 58, 59 and 60.

The third switching device 19 and the electrical resistor 18 operate depending on the position of the fourth switching device 53. A first position of the fourth switching device 53 couples the electrical resistor 18 to a reference potential 54 in the form of a ground potential; a second position couples the electrical resistor 18 to the pole D in the embodiment shown.

In this case, the internal resistance of the third switching device and of the fourth switching device 53 is typically small relative to the electrical resistor 18 in order to minimize an error contribution when determining the internal resistance of the second energy store.

A superordinate control unit, which forms an internal resistance determining unit 21 already explained in association with the previous figures, supervises the switching and measuring sequence. In this case, the internal resistance determining unit 21 configures all function blocks within the module 51. The internal resistance determining unit 21 has the possibility of diagnosing the state of all the modules, i.e. of the module 52 and of the voltage determining unit 20.

Furthermore, the internal resistance determining unit 21 determines, in particular, a resistance value characterizing the internal resistance of the second energy store, as is explained further below.

For this purpose, the first, second, third and fourth current values explained above are read in via the signal lines 57, 58, 59 and 60.

The voltage $U_{BAT\_ES2}$ of the second energy store is furthermore read in. The first, second, third and fourth current values and the voltage of the second energy store are detected substantially simultaneously.

The internal resistance determining unit 21 determines the system resistances, in particular a resistance value characterizing the internal resistance of the second energy store. In conjunction with the system signals of first, second, third and fourth current values and voltage of the second energy store before and during the connection of the electrical resistor 18, the internal resistance determining unit 21 plausibilizes the calculated system resistances. The internal resistance determining unit 21 can transfer the calculated system parameters additionally to a further control unit in the overall system.

Furthermore, the internal resistance determining unit 21 has the possibility of optimizing, i.e. minimizing, the switch-on time of the electrical resistor 18 in an adaptive process, as will be explained in greater detail in association with the following figure. In addition, the deactivation time of the third switching device 19 can be configured.

The module 51 can be partly monolithically integrated with the drive units 41, 42 and 43. In this case, partly monolithically means that the internal resistance determining unit 21, the third switching device 19, the fourth switching device 53 and the electrical resistor 18 are excluded from the integration.

Figure 4:
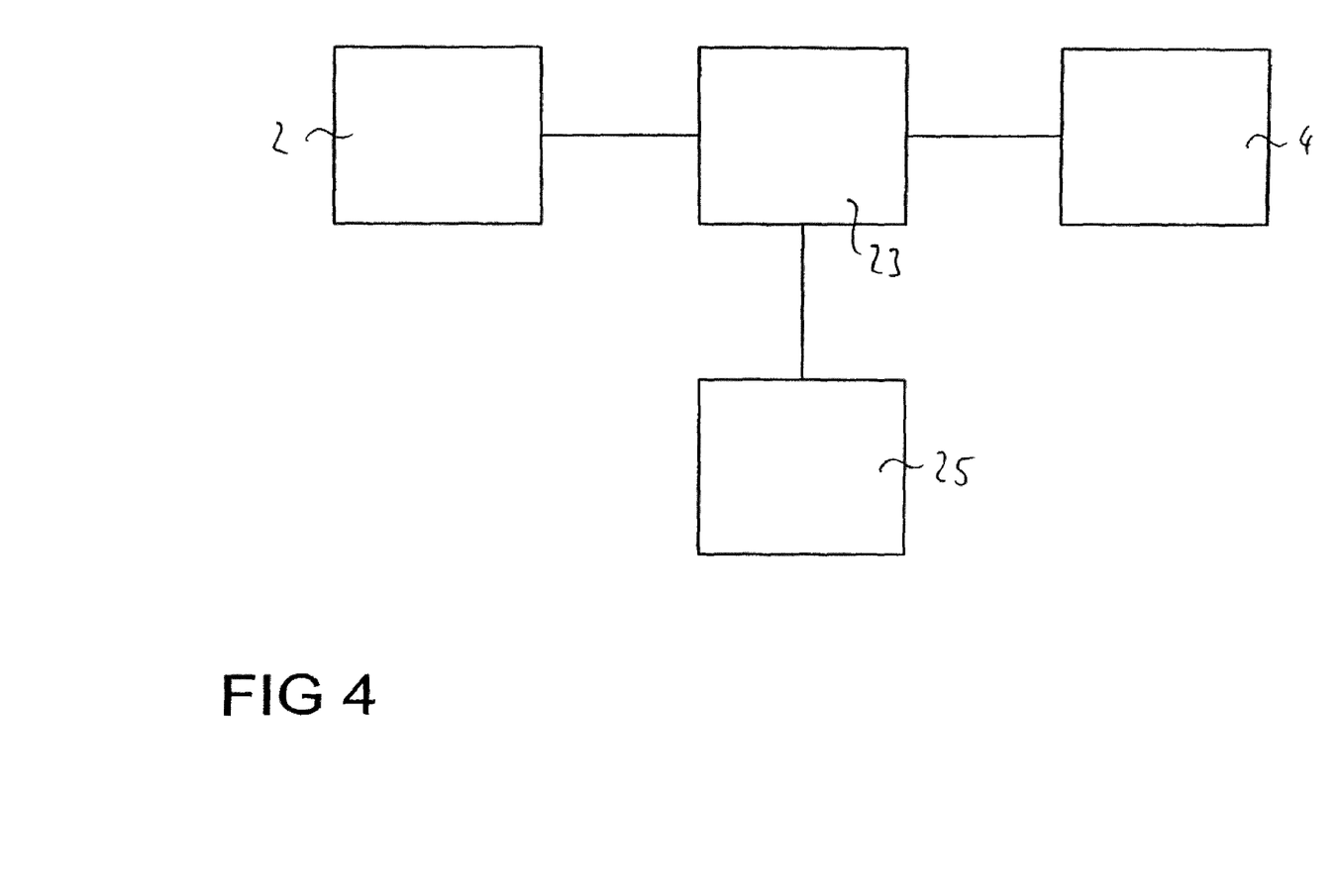
FIG. 4 shows a basic circuit diagram of on-board electrical systems according to the invention.

FIG. 4 shows a basic circuit diagram of on-board electrical systems according to the invention. Components having the same functions as in the previous figures are identified by the same reference signs and will not be explained again below.

As is illustrated schematically in FIG. 4, an energy exchange between the first on-board electrical system branch 2, which forms a first energy system Esys1, the second on-board electrical system branch 4, which forms a second energy system Esys2, and the third on-board electrical system branch 25, which forms a third energy system Esys3, can be carried out by means of the control unit 23. The control unit 23 connects the three energy systems Esys1, Esys2 and Esys3 to one another and thus enables the energy exchange between the three systems.

Particularly on-board electrical systems in vehicles can consist of or comprise the three energy systems Esys1, Esys2 and Esys3. By way of example, lead-acid rechargeable batteries can be used within the energy system Esys1.

Furthermore, energy stores such as, for example, double-layer capacitors or lithium-ion cells are used within the energy systems, particularly in Esys2. These energy stores are used to provide energy for sensitive system loads in the event of a voltage dip in Esys1, for example in the event of an engine start. The generator, integrated for example in Esys3, provides the energy for Esys1 and Esys2.

Figure 5:
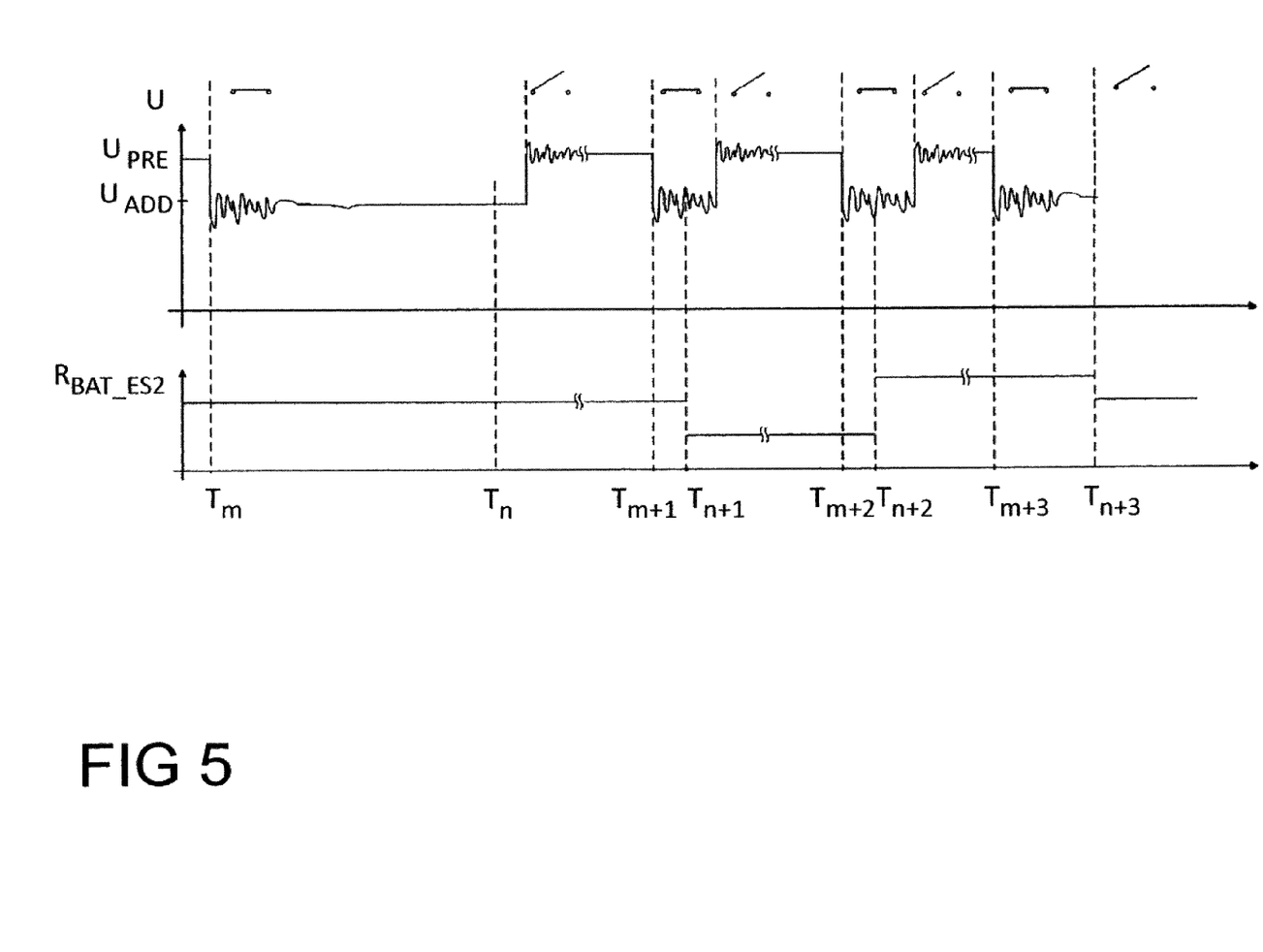
FIG. 5 shows one example of a possibility for configuration of the duration of the closed state of the third switching device shown in FIG. 3.

FIG. 5 shows one example of a possibility for configuration of the duration of the closed state of the third switching device shown in FIG. 3.

In this respect, FIG. 5 shows an illustration of the temporal profile of the voltage U of the second energy store and of—determined therefrom—the resistance value characterizing the internal resistance of the second energy store, which is designated by $R_{BAT\_ES2}$ in FIG. 5.

By varying the loading times, i.e. the duration of the closed state of the third switching device 19 illustrated in FIG. 3 and thus the time duration of the state in which the electrical resistor is electrically coupled to the first terminal of the second energy store, with a corresponding plausibilization of the measurement results that result therefrom, the measurement mechanism can independently set itself to a system characteristic or be set thereto. In this case, the system characteristic should be understood to mean the static and/or dynamic impedances of the overall arrangement which can be represented in an equivalent circuit diagram.

If the point in time for the voltage measurement of the second energy store after the connection of the load resistance $R_{ADD}$ is not chosen suitably relative to the system time constants, incorrect resistance values are determined for the internal resistance of the second energy store. "Settling" of the voltage at the measurement point C or D should be implemented in order to minimize the measurement errors.

An excessively long activation of the third switching device, the switching states of which are illustrated schematically in FIG. 5, has the consequence, by contrast, that the load resistance $R_{ADD}$ generates an increased power loss. An improvement in the measurement result is not achieved thereby, however.

FIG. 5 illustrates an independent optimization of the measurement by reduction of the measurement intervals to the shortest possible measurement interval with an acceptably accurate measurement value, wherein a closed state of the third switching device in FIG. 5 is represented by a closed switch symbol and an open state of the third switching device is represented by an open switch symbol.

In this case, the third switching device is closed at the points in time $T_m$, $T_{m+1}$, $T_{m+2}$ and $T_{m+3}$. The measurement of the voltage of the second energy store in the closed switching state of the third switching device is carried out in each case at the points in time $T_n$, $T_{n+1}$, $T_{n+2}$ and $T_{n+3}$. At the points in time $T_{n+1}$ and $T_{n+2}$, the settling process for the voltage of the second energy store after the closing of the third switching device has not yet ended. By contrast, the measurement of the voltage of the second energy store at the point in time $T_n$ leads to a long activation of the third switching device and thus to an increased power loss. The point in time $T_{n+3}$ forms as optimum a point in time as possible for the measurement of the voltage of the second energy store in the closed switching state of the third switching device. After the measurement of the voltage carried out at the point in time $T_{n+3}$, the third switching device is subsequently opened again.

A variation of the duration of the closed state of the third switching device and thus of the time duration of the state in which the electrical resistor is electrically coupled to the first terminal of the second energy store can be carried out here by means of a preferably monolithically integrated, adjustable timer. The advantage of a monolithic integration here is that overloading of the electrical resistor can be reliably avoided.

This affords the possibility of continuously determining a suitable point in time for measurement by means of an adaptive mechanism and thus of achieving a higher measurement accuracy and of minimizing the power loss of the measurement arrangement. In this case, the adaptive mechanism is typically implemented at least once per journey cycle of the vehicle.

LIST OF REFERENCE SIGNS 1 on-board electrical system
2 on-board electrical system branch
3 energy store
4 on-board electrical system branch
5 energy store
6 DC/DC converter
7,8 switching device
9 terminal
10-12 node
13 terminal
14-17 current determining unit
18 resistor
19 switching device
20 voltage determining unit
21 internal resistance determining unit
22 load
23 control unit
24 load
25 on-board electrical system branch
26 load
27-39 terminal
40 generator
41-43 drive unit
44 node
45-47 resistor
48 starter
49-50 terminal
51, 52 module
53 switching device
54 reference potential
55, 56 control line
57-60 signal line
61 measurement line
62 voltage tap
63 terminal
A-D pole

What is claimed is:

1. An on-board electrical system for a vehicle, the system comprising:
a first on board electrical system branch comprising a first energy store,
a second on board electrical system branch comprising a second energy store,
a DC/DC converter bidirectionally transferring energy between the first on-board electrical system branch and the second on-board electrical system branch,
a first switching device and a second switching device, wherein a first terminal of the second energy store is electrically couplable to a first terminal of the first energy store via a first node, a second node, and a third node by means of the first switching device and the second switching device,
a first current determining unit for determining a first current value of a first current flowing between the first terminal of the first energy store and the first node,
a second current determining unit for determining a second current value of a second current flowing via the first switching device and the second switching device,
a third current determining unit for determining a third current value of a third current flowing between the first terminal of the second energy store and the second node,
a fourth current determining unit determining a fourth current value of a fourth current flowing between the third node and the DC/DC converter,
an electrical resistor, wherein the electrical resistor is electrically couplable to the first terminal of the second energy store by means of a third switching device,
a voltage determining unit for determining a first voltage value of a voltage of the second energy store if the electrical resistor is electrically isolated from the first terminal of the second energy store and a second voltage value of the voltage of the second energy store if the electrical resistor is electrically coupled to the first terminal of the second energy store,
an internal resistance determining unit for determining a resistance value characterizing an internal resistance of the second energy store on the basis of the determined first voltage value and the determined second voltage value and for classifying the determined resistance value on the basis of the determined first, second, third and fourth current values.

2. An on-board electrical system for a vehicle comprising:
a first on board electrical system branch comprising a first energy store,
a second on board electrical system branch comprising a second energy store,
wherein a first terminal of the second energy store is electrically couplable to a first terminal of the first energy store via a first node and a second node,
a DC/DC converter bidirectionally transferring energy between the first on-board electrical system branch and the second on-board electrical system branch,
a first switching device and a second switching device, wherein the first terminal of the second energy store is electrically couplable to a reference potential by means of the first switching device and the second switching device,
a first current determining unit determining a first current value of a first current flowing between the first terminal of the first energy store and the first node,
a second current determining unit for determining a second current value of a second current flowing via the first switching device,
a third current determining unit for determining a third current value of a third current flowing between the first terminal of the second energy store and the second node,
a fourth current determining unit for determining a fourth current value of a fourth current flowing between the first node and the DC/DC converter and/or a fourth current flowing between the second node and the DC/DC converter,
an electrical resistor electrically
couplable to the first terminal of the second energy store by means of a third switching device,
a voltage determining unit for determining a first voltage value of a voltage of the second energy store if the electrical resistor is electrically isolated from the first terminal of the second energy store and determining a second voltage value of the voltage of the second energy store if the electrical resistor is electrically coupled to the first terminal of the second energy store, an internal resistance determining unit for determining a resistance value characterizing an internal resistance of the second energy store on the basis of the determined first voltage value and the determined second voltage value and for classifying the determined resistance value on the basis of the determined first, second, third and fourth current values.

3. The on-board electrical system according to claim 1, wherein the electrical resistor has a predetermined resistance value.

4. The on-board electrical system according to claim 1, wherein the internal resistance determining unit classifies the determined resistance value on the basis of the determined first voltage value and the determined second voltage value.

5. The on-board electrical system according to claim 1, wherein the first on-board electrical system branch additionally comprises a first electrical load.

6. The on-board electrical system according to claim 1, wherein the DC/DC converter, the first switching device, the second switching device, the third switching device, the electrical resistor and the internal resistance determining unit are part of a control unit.

7. The on-board electrical system according to claim 1, wherein the first switching device, the second switching device, and the third switching device are selected from the group consisting of a relay and a semiconductor switch.

8. The on-board electrical system according to claim 1, wherein the second on-board electrical system branch additionally comprises a second electrical load.

9. The on-board electrical system according to claim 1, furthermore comprising a third on-board electrical system branch comprising a third electrical load.

10. A method for operating an on-board electrical system for a vehicle, the system comprising:
- a first on-board electrical system branch comprising a first energy store,
- a second on-board electrical system branch comprising a second energy store,
- a DC/DC converter bidirectionally transferring energy between the first on-board electrical system branch and the second on-board electrical system branch,
- a first switching device and a second switching device, wherein a first terminal of the second energy store is electrically couplable to a first terminal of the first energy store via a first node, a second node, and a third node by means of the first switching device and second switching device,
- a first current determining unit for determining a first current value of a first current flowing between the first terminal of the first energy store and the first node,
- a second current determining unit for determining a second current value of a second current flowing via the first switching device and the second switching device,
- a third current determining unit for determining a third current value of a third current flowing between the first terminal of the second energy store and the second node,
- a fourth current determining unit determining a fourth current value of a fourth current flowing between the third node and the DC/DC converter,
- an electrical resistor, wherein the electrical resistor is electrically couplable to the first terminal of the second energy store by means of a third switching device,
- a voltage determining unit for determining a first voltage value of a voltage of the second energy store if the electrical resistor is electrically isolated from the first terminal of the second energy store and a second voltage value of the voltage of the second energy store if the electrical resistor is electrically coupled to the first terminal of the second energy store,
- an internal resistance determining unit for determining a resistance value characterizing an internal resistance of the second energy store on the basis of the determined first voltage value and the determined second voltage value and for classifying the determined resistance value on the basis of the determined first, second, third and fourth current values;

wherein the method comprises:
  determining a first voltage value of a voltage of the second energy store by means of the voltage determining unit, a first current value by means of the first current determining unit, a second current value by means of the second current determining
  unit, a third current value by means of the third current determining unit and a fourth current value by means of the fourth current determining unit if the electrical resistor is electrically isolated from the first terminal of the second energy store,
  closing the third switching device,
  determining a second voltage value of the voltage of the second energy store and repeatedly determining a first current value by means of the first current determining unit, a second current value by means of the second current determining unit, a third current value by means of the third current determining unit and a fourth current by means of the fourth current determining unit if the electrical resistor is electrically coupled to the first terminal of the second energy store,
  determining a resistance value characterizing an internal resistance of the second energy store on the basis of the determined first voltage value and the determined second voltage value,
  classifying the determined resistance value on the basis of the determined first, second, third and fourth current values.

11. The method as claimed in claim 10, wherein classifying the determined resistance value comprises comparing in each case the first current values determined before and after the closing of the third switching device, the second current values determined before and after the closing of the third switching device, the third current values determined before and after the closing of the third switching device and the fourth current values determined before and after the closing of the third switching device with one another.

12. The method as claimed in claim 10, wherein classifying the determined resistance value is additionally carried out on the basis of the determined first voltage value and the determined second voltage value.

13. The method as claimed in claim 10, wherein a time determination is additionally carried out after the third switching device has been closed, and wherein determining the second voltage value is carried out after a predetermined time duration after the beginning of the time determination.

14. The method as claimed in claim 10, wherein, after the closing of the third switching device, the voltage of the second energy store is repeatedly determined, and wherein the second voltage value is determined if a deviation of successively determined values of the voltage from one another falls below a predetermined threshold value.

15. The method as claimed in claim 10, wherein the method additionally comprises the following steps after determining the resistance value characterizing the internal resistance of the second energy store:

opening the third switching device, determining a third voltage value of the voltage of the second energy store and repeatedly determining a first current value by means of the first current determining unit, a second current value by means of the second current determining unit, a third current value by means of the third current determining unit and a fourth current value by means of the fourth current determining unit if the electrical resistor is electrically isolated from the first terminal of the second energy store, wherein classifying the determined resistance value is additionally carried out on the basis of the determined third voltage value and the determined first, second, third and fourth current values which are determined if the electrical resistor is electrically isolated from the first terminal of the second energy store.

16. The on-board electrical system according to claim 2, wherein the electrical resistor has a predetermined resistance value.

17. The on-board electrical system according to claim 2, wherein the internal resistance determining unit classifies the determined resistance value on the basis of the determined first voltage value and the determined second voltage value.

18. The on-board electrical system according to claim 2, wherein the first on-board electrical system branch additionally comprises a first electrical load.

19. The on-board electrical system according to claim 2, wherein the second on-board electrical system branch additionally comprises a second electrical load.

20. The on-board electrical system according to claim 2, furthermore comprising a third on-board electrical system branch, wherein the third on-board electrical system branch comprises a third electrical load.

\* \* \* \* \*